United States Patent [19]

Woermbke

[11] 4,270,106

[45] May 26, 1981

[54] BROADBAND MODE SUPPRESSOR FOR MICROWAVE INTEGRATED CIRCUITS

[75] Inventor: James D. Woermbke, Glen Burnie, Md.

[73] Assignee: The United States of America as represented by the Secretary of the Air Force, Washington, D.C.

[21] Appl. No.: 91,993

[22] Filed: Nov. 7, 1979

[51] Int. Cl.³ .............................................. H01P 1/16
[52] U.S. Cl. ..................................... 333/246; 333/251
[58] Field of Search ................ 333/1.1, 238, 246, 251

[56] References Cited

U.S. PATENT DOCUMENTS

| 3,831,114 | 8/1974 | Paglione | 333/1.1 |
| 3,863,181 | 1/1975 | Glance et al. | 333/251 X |
| 3,936,778 | 2/1976 | De Ronde | 333/246 |
| 4,037,182 | 7/1977 | Burnett et al. | |

Primary Examiner—Paul L. Gensler
Attorney, Agent, or Firm—Donald J. Singer; Willard Matthews, Jr.

[57] ABSTRACT

Microwave integrated circuits are enclosed in metal boxes. As more functions are added to circuits RF moding increases. One method of minimizing RF moding is to place a post in the box. This invention broadens the band of frequencies controlled by the post method by attaching a lossy RF absorbing pellet to the end of the mode suppression post.

2 Claims, 3 Drawing Figures

BROADBAND MODE SUPPRESSOR FOR MICROWAVE INTEGRATED CIRCUITS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to mode suppression in microwave circuits and more particularly to a means for broadband mode suppression in integrated circuits.

Where electromagnetic wave energy is transmitted in hollow pipe like waveguides it is well documented that, dependent on the size and shape of the waveguide, characteristic electric and magnetic field configurations are generated. These fields are referred to as "modes". Modes are a function of frequency as well as physical characteristics of the waveguide.

Generally it is well established that the larger the wave guide and the higher the frequency the more numerous the modes created. While it is most desirable to confine these modes to a single fundamental mode, frequently devices added to the waveguide as mode suppressors actually induce high frequency moding not compensated for by fundamental mode suppression.

A more recent problem that has tended to effect waveguide transmission is increase in functions that are added to microwave integrated circuit modules. These devices known in the art as "super modules" have severe difficulties relating to moding and circuit isolation. Most microwave integrated circuits are fabricated in substrates with a low loss, high dielectric constant using microstrip circuit topology.

When utilizing a microstrip any circuit discontinuities vertical to the top plane of the microstrip circuit tend to both radiate and couple RF energy relative to each other. Although great care is exercised in the design of such circuits in an effort to minimize such discontinuities, chip capacitors, RF chokes, inter-line connects and other devices all contribute to the basic radiation problem.

As more circuit functions are added to the module, the size or surface area required to implement the circuit increases. This increase in turn requires the use of larger external metal boxes or enclosures which serve not only as a mechanized holder providing physical protection, but also, furnishes necessary RFI and EMI protection to both incoming and outgoing RF signals. These enclosures are frequently machined from aluminum.

There is a critical set of internal dimensions for the enclosure which depend upon frequency and when reached will support a waveguide or cavity mode. This RF energy is launched from the aforementioned circuit discontinuities. Although there are a substantial number of possible results of these highly undesired waveguide modes examples include, circuit oscillation, so-called resonant suck-outs within band, loss of isolation between circuits employing dual or multi channel designs and bandwidth shrinkage problems.

A well known method of suppressing RF moding within a metal enclosure is with the precise placement of metal posts connecting the top cover to the bottom ground surface. The post being parallel to the E field produces an RF short. When the post is placed in the center of the box, in the direction of RF propagation, then the minimum effect propagation frequency will be appropriately doubled in the region of the post. While this technique is very effective for mode suppression of the fundamental frequency, high frequency moding can exist and actually be induced by the addition of fundamental mode suppressors.

The proposed invention discloses a low cost technique for producing very broad band mode suppressors that are effective not only at the fundamental frequency but also at frequencies above and below the fundamental frequency.

SUMMARY OF THE INVENTION

The invention is an improvement over prior art microwave mode suppression devices. Utilizing a conventional metal enclosure having a microstrip integrated circuit contained therein, and utilizing a post type fundamental mode suppressor, a lossy RF absorbing pellet is attached at one end of the mode suppressing post. The pellet is most desirably formed from an iron loaded rubber material which is easily handled and otherwise reliable in performance under various operating conditions.

The lossy reactance resulting from the pellet is very effective since the RF loss characteristics generally increase with frequency, the lossy pellet loads even more heavily at the higher harmonic frequencies then it does at the fundamental frequencies. Further, low frequency RF circulatory currents flowing through the post tend to be loaded thus aiding in suppressing potential low frequency oscillations caused by undesired ground currents.

It is therefore an object of the invention to provide a new and improved broadband mode suppressor for microwave integrated circuits.

It is another object of the invention to provide a new and improved broadband mode suppressor that is simple and requires no maintenance.

It is a further object of the invention to provide a new and improved broadband mode suppressor that is adaptable to currently available mode suppression systems.

It is still another object of the invention to provide a new and improved broadband mode suppressor that is inexpensive to produce and highly reliable.

It is still a further object of the invention to provide a new and improved broadband mode suppressor for microwave integrated circuits that stabilizes circuit modules.

It is another object of the invention to provide a new and improved broadband mode suppressor that improves isolation in microstrip circuits.

These and other objects, features and advantages will become more apparent after considering the following detailed description taken in conjunction with the annexed drawings and appended claims.

DESCRIPTION OF THE PREFERRED EMBODIMENT

Figure 1:
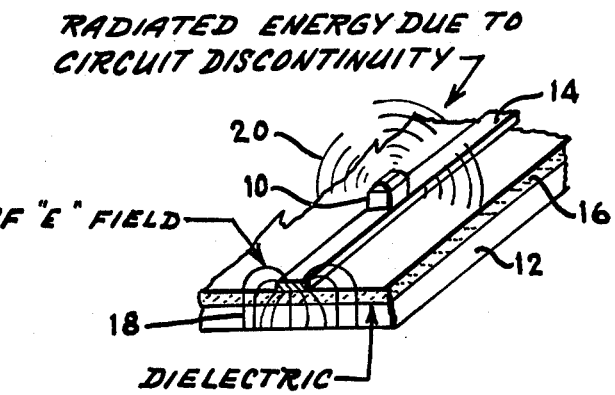
FIG. 1 shows an example of circuit discontinuities in microstrip circuits.

Referring now to FIG. 1, there is shown an example of radiated RF energy due to a circuit discontinuity in the form of a chip component 10. An enclosure shown cutaway at 12 contains a microstrip circuit 14 mounted on a dielectric 16. The RF "E" field 18 generated by the microstrip circuit 14 and the field 20 caused by chip component 10 will couple RF energy one relative to another.

As the size of the microstrip circuit and the number of chip components increases the size of the enclosure necessarily increases. Depending upon the frequency, when the size of the enclosure reaches a critical dimension the enclosure itself will support a waveguide or cavity mode created from these circuit discontinuities.

Figure 2:
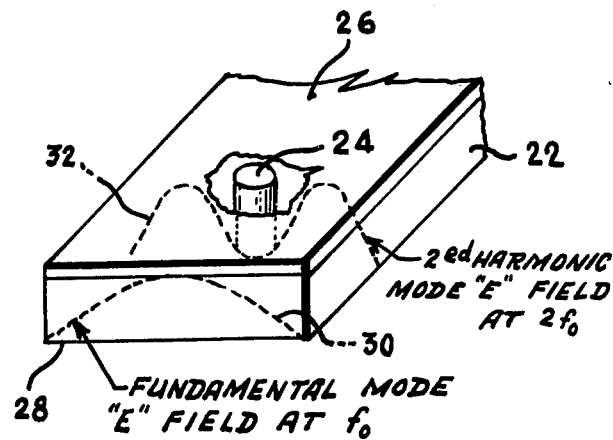
FIG. 2 is a schematic representation of a microwave mode suppression device.

One method of controlling and suppressing unwanted modes is shown in FIG. 2. An enclosure 22 formed of a metal box like structure contains a mode suppression post 24. The post or posts as the case may be, connect the top cover 26 to the bottom ground surface 28. Being parallel to "E" field (30) the post produces an RF short. By placing post 24 in the center of the enclosure in the direction of RF propagation, the minimum effective propagation frequency will be approximately double in the region of the post which effectively suppresses the fundamental mode frequency (30) but may actually induce high frequency moding (32).

Figure 3:
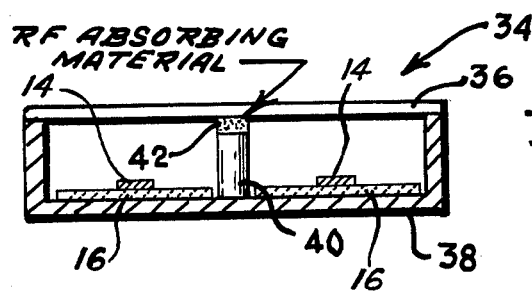
FIG. 3 is an end view of a microwave mode suppression device utilizing this invention.

FIG. 3 concerns a method and means for suppressing modes not only at the fundamental frequency but also at frequencies above and below the fundamental.

Viewing the enclosure shown generally at 34 from the end, with cover 36, base 38 and metal post 40, post 40 rises from the base just short of cover 36. Between the end of post 40 and cover 36 is a lossy RF absorbing pellet 42, fabricated from an iron loaded rubber material.

With the addition of pellet 42 RF loss characteristics increase with frequency at the higher harmonic frequencies and low frequency RF circulator currents flowing through post 40 tend to be loaded thereby suppressing low frequency oscillations caused by unwanted ground currents.

In practice, a device with inferior channel to channel isolation measuring in the order of 30 to 40 dB was improved to 60 to 70 dB (depending upon frequency) with the insertion of two "lossy posts" according to the invention. Further, a substantial increase in stability was noted over its range of operating conditions.

Although the invention has been described with reference to a particular embodiment, it will be understood to those skilled in the art that the invention is capable of a variety of alternative embodiments within the spirit and scope of the appended claims.

I claim:

1. A broadband mode suppressor for microwave integrated circuits comprising: a housing having first and second walls, a top and bottom; a microwave integrated circuit located on the bottom of the housing, said circuit including chip components forming circuit discontinuities and causing undesired RF modes; a metal post mounted on the bottom of the housing and extending in the direction of the top of the housing for suppressing an undesired fundamental radiation mode; a lossy RF absorbing pellet positioned between the said post and top of the housing for suppressing RF modes at higher harmonic frequencies and lower frequencies than the fundamental frequency.

2. A broadband mode suppressor for microwave integrated circuits according to claim 1 wherein the RF absorbing pellet is formed from an iron loaded rubber material.

* * * * *